United States Patent
Lee et al.

(10) Patent No.: US 7,507,993 B2
(45) Date of Patent: Mar. 24, 2009

(54) DOUBLE-SIDED DISPLAY

(75) Inventors: Chung-Chun Lee, Yunlin County (TW); Chun-Yi Chiu, Taoyuan County (TW)

(73) Assignee: Au Optronics Corp., Hsinchu (TW)

( * ) Notice: Subject to any disclaimer, the term of this patent is extended or adjusted under 35 U.S.C. 154(b) by 325 days.

(21) Appl. No.: 11/424,974

(22) Filed: Jun. 19, 2006

(65) Prior Publication Data
US 2007/0164659 A1 Jul. 19, 2007

(30) Foreign Application Priority Data
Jan. 18, 2006 (TW) ................. 95101846 A

(51) Int. Cl.
*H01L 51/10* (2006.01)
(52) U.S. Cl. ................ 257/59; 257/40; 257/72; 257/E51.018
(58) Field of Classification Search ......... 257/40, 257/59, 72, E51.018
See application file for complete search history.

(56) References Cited
U.S. PATENT DOCUMENTS

| 6,677,610 B2 * | 1/2004 | Choi et al. ............... 257/59 |
| 7,350,326 B2 * | 4/2008 | Hu ............... 40/544 |
| 2004/0263759 A1 | 12/2004 | Matsuhira et al. |
| 2007/0120478 A1 * | 5/2007 | Lee et al. ............... 313/512 |
| 2007/0164659 A1 * | 7/2007 | Lee et al. ............... 313/500 |
| 2007/0220792 A1 * | 9/2007 | Capurso et al. ............... 40/463 |

FOREIGN PATENT DOCUMENTS

| CN | 1571606 | 1/2005 |
| CN | 1576980 | 2/2005 |
| CN | 1617192 | 5/2005 |

OTHER PUBLICATIONS

CN Office Action mailed Oct. 12, 2007.

* cited by examiner

*Primary Examiner*—Victor A Mandala
(74) *Attorney, Agent, or Firm*—Thomas, Kayden, Horstemeyer & Risley

(57) ABSTRACT

A double-sided display comprises a first organic light emitting device with a first transparent substrate, and the first organic light emitting device illuminates toward the first substrate. A second organic light emitting device with a second transparent substrate opposite to the first substrate, and the second organic light emitting device illuminates toward the second substrate. The first organic light emitting device is separated from the second organic light emitting device by a gap. A controller, coupled to the first and second organic light emitting devices, receives a control signal to individually switch the power of the first and second organic light emitting devices.

6 Claims, 3 Drawing Sheets

DOUBLE-SIDED DISPLAY

BACKGROUND OF THE INVENTION

1. Field of the Invention

The invention relates to double-sided display, and in particular, to a control device managing illumination of a double-sided display.

2. Description of the Related Art

FIG. 1 is a cross section of a conventional double-sided organic light emitting display. A first organic light emitting device 102 and a second organic light emitting device 104 are deposited in parallel, partitioned with a space 130 therebetween. A first transparent substrate 110 and the first organic light emitting device 102 form an upper panel, and the first organic light emitting device 102 illuminates upward through the transparent substrate 110. The second transparent substrate 120 and the second organic light emitting device 104 form a lower panel, and the second organic light emitting device 104 illuminates in the opposite direction through the transparent substrate 120. An encapsulant 122 is deposited as a sidewall between the first organic light emitting device 102 and second organic light emitting device 104, forming a sealed space to avoid moisture penetration. A dryer material may also be placed in the sealed space to protect the electronic components from moisture corrosion. In some case, the sealed space is filled with special materials. Typically, the areas of the first organic light emitting device 102 and second organic light emitting device 104 are not necessarily identical, and the relative position thereof can vary. The first organic light emitting device 102 and second organic light emitting device 104 may be organic light emitting diode (OLED) or polymer light emitting diode (PLED), and the driving mode may be passive matrix or active matrix. The double-sided display 100 is widely adapted, such as collapsible mobile phones. The architecture of double-sided display 100 effectively reduces thickness and cost. A double sided LCD requires only one backlight source to illuminate both sides. On the contrary, the OLEDs in the double-sided display 100 are not based on a backlight source, thus an improved driving mechanism is desirable.

BRIEF SUMMARY OF INVENTION

A detailed description is given in the following embodiments with reference to the accompanying drawings.

An exemplary embodiment of a double-sided display comprises a first organic light emitting device having a first surface toward which the first organic light emitting device illuminates. A second organic light emitting device has a second surface opposite to the first surface, and is deposited above the first organic light emitting device, illuminating toward the second surface. The first organic light emitting device is separated from the second organic light emitting device by a gap. A controller, coupled to the first and second organic light emitting devices, receives a control signal to individually switch power of the first and second organic light emitting devices.

The double-sided display may comprise a first transparent substrate, where the first organic light emitting device is deposited on its first surface. A second organic light emitting device is deposited above the second transparent substrate. An sealant is filled between the first and second organic light emitting devices, forming an isolated sealed space therebetween.

The controller may comprise first and second switches. The first switch is coupled to the first organic light emitting device, conducting a power signal to the first organic light emitting device. The second switch is coupled to the second organic light emitting device, conducting the power signal to the second light emitting device. The control signal control on and off status of the first and second organic light emitting devices through the first and second switches.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
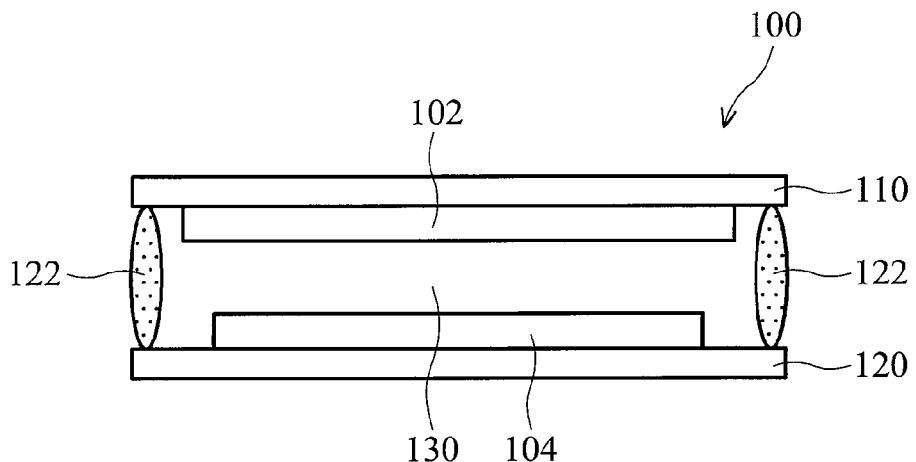
FIG. 1 is cross section of a conventional double-sided organic light emitting display.
Figure 2:
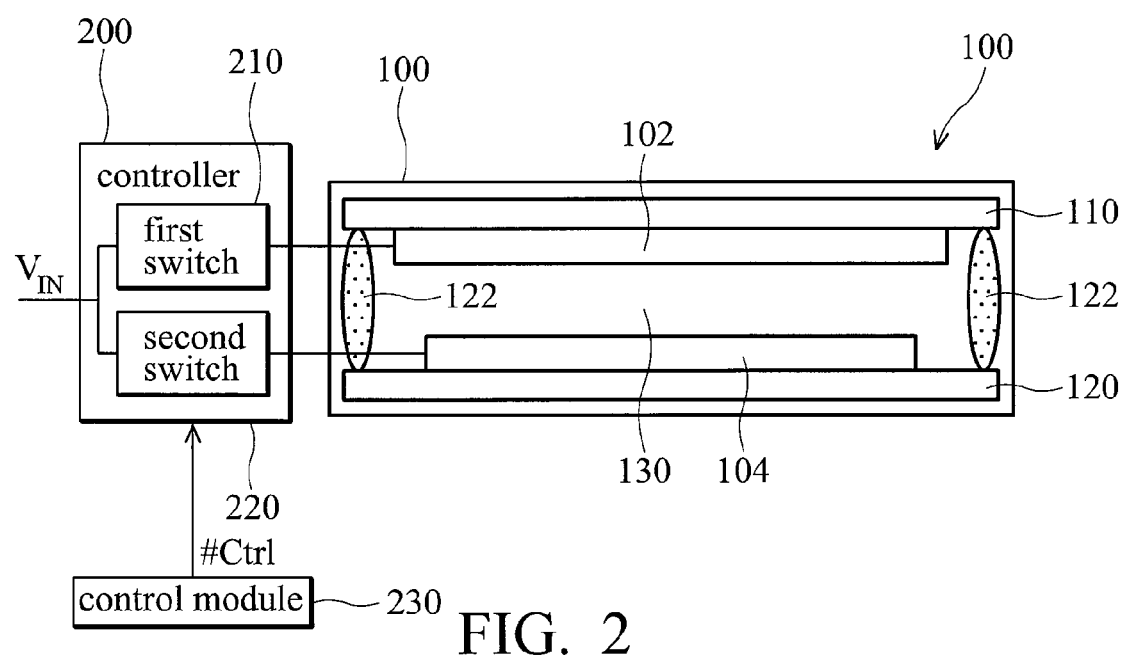
FIG. 2 is a schematic view of an embodiment of a double-sided organic light emitting display.

FIG. 2 is a schematic view of an embodiment of the double-sided organic light emitting display. The double-sided display 100 comprises the following components. A first organic light emitting device 102 and a first transparent substrate 110 on it form the first panel. The first organic light emitting device 102 illuminates toward the first surface through the transparent substrate 110. Similarly, a second organic light emitting device 104 and a second transparent substrate 120 on it form the second panel. The second organic light emitting device 104 illuminates toward the second surface through the second transparent substrate 120. An sealant 122 between the first organic light emitting device 102 and second organic light emitting device 104 acts as a sidewall, sealing the space therebetween. A controller 200 is coupled to the first organic light emitting device 102 and the second organic light emitting device 104 to receive a control signal #ctrl, and the power switches of the first organic light emitting device 102 and second organic light emitting device 104 are controlled thereby. A power signal $V_{IN}$ is individually sent to the first organic light emitting device 102 and second organic light emitting device 104 according to the switch status thereof. The controller 200 comprises a first switch 210 and a second switch 220. The first switch 210 is coupled to the first organic light emitting device 102, and the power signal is conducted thereby. The second switch 220 is coupled to the second organic light emitting device 104, conducting the power signal thereto. The control signal #ctrl individually activates or deactivates the first switch 210 and the second switch 220, with the first organic light emitting device 102 and the second organic light emitting device 104 turned on or off correspondingly. The control signal may be generated by a control module 230 implemented by software or a hardware controller.

Figure 3A:
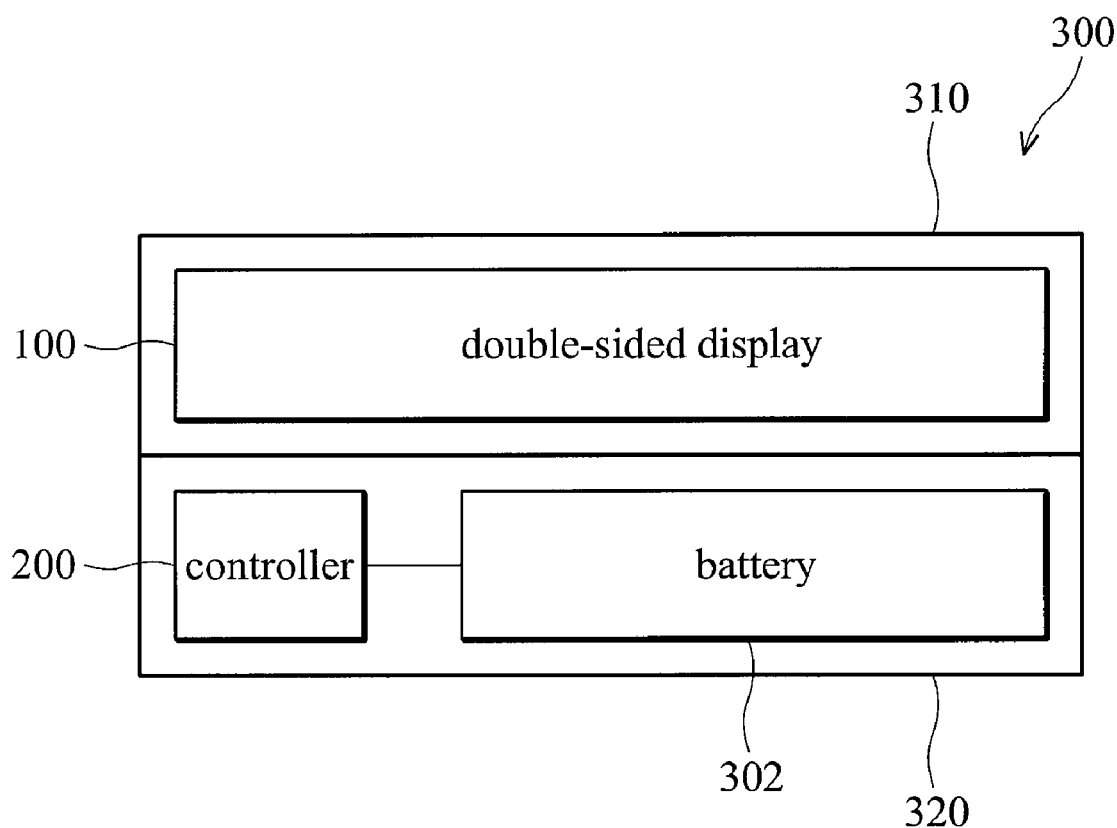
FIGS. 3a and 3b show embodiments of collapsible devices according to the invention.
Figure 3B:
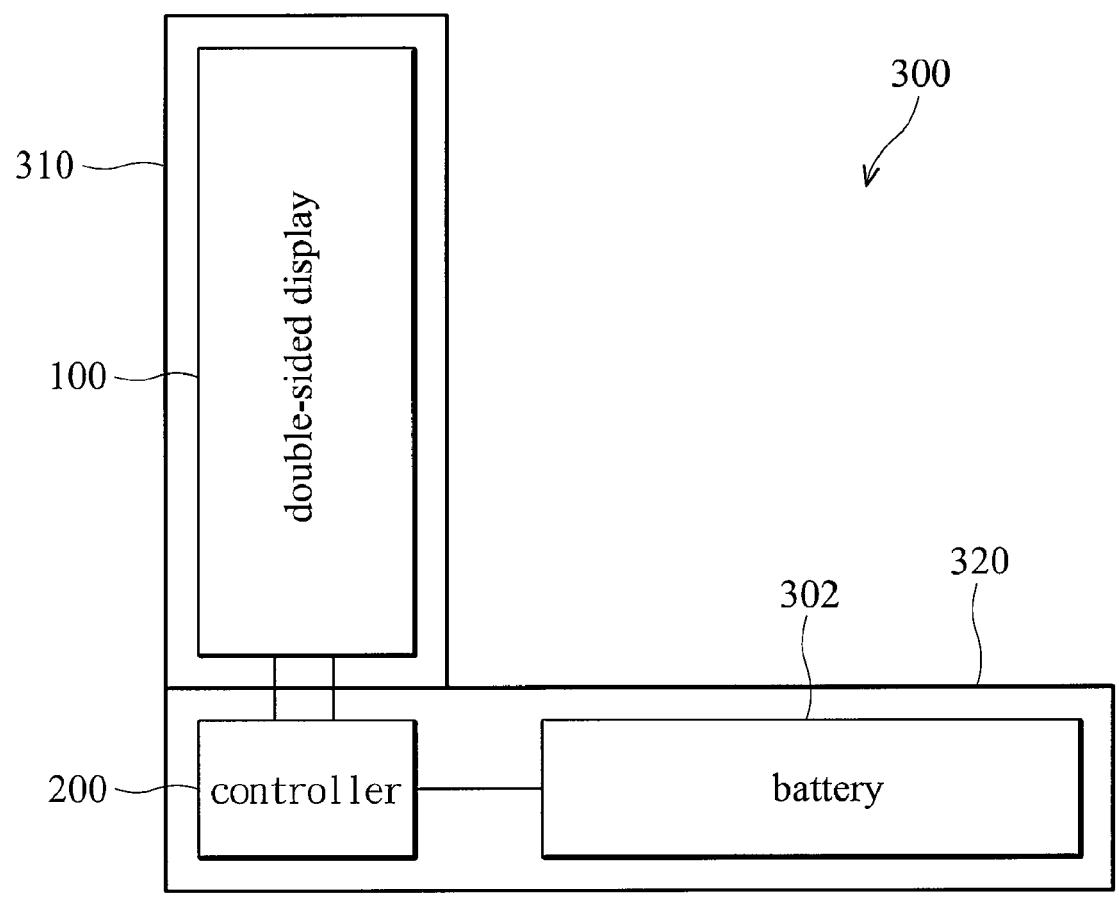

FIGS. 3a and 3b are embodiments of collapsible devices according to the invention. The collapsible mobile phone 300 comprises an upper shell 310 and a lower shell 320. The transparent substrate 110 is deposited in the upper shell 310, and the controller 200 is in the lower shell 320. The lower shell 320 comprises a battery 302 coupled to the controller 200, providing power supply for the double-sided display 100. The collapsible mobile phone 300 may comprise a button (such as the control module 230 in FIG. 2) detecting the positions of the upper shell 310 and lower shell 320. FIG. 3a shows the collapsible device in collapsed status. In this case, the second organic light emitting device 104 is inside, and the button sends the control signal #ctrl to the controller 200, deactivating the second switch 220 to disable the second organic light emitting device 104. The first organic light emitting device 102 is outside the upper shell 310, and operation thereof is determined by software.

FIG. 3b shows the collapsible mobile phone 300 opened. The first organic light emitting device 102 and second organic light emitting device 104 on the upper shell 310 are fully functional in this case. Operations of the first organic light emitting device 102 and second organic light emitting device 104 are thus controlled by software. Additionally, the control module 230 may also be manually controllable by users. The first organic light emitting device 102 and second organic light emitting device 104 may be AMOLED or PMOLED simultaneously or individually. The first organic light emitting device 102 and the second organic light emitting device 104 may also be RGB side-by-side OLED or white OLED (WOLED) simultaneously or individually. As well as the collapsible mobile phone in FIGS. 3a and 3b, the double-sided display may also be adapted for digital camera, digital video recorder, laptop, and portable media player use.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A double-sided display, comprising
   a first substrate;
   a second substrate;
   a first organic light emitting device, disposed on the first substrate, for illuminating toward the first substrate;
   a second organic light emitting device, disposed on the second substrate, for illuminating toward the second substrate, wherein the first organic light emitting device is separated from the second organic light emitting device by a gap;
   a first switch coupled to the first organic light emitting device for conducting a power supply to the first organic light emitting device;
   a second switch coupled to the second organic light emitting device for conducting the power supply to the second organic light emitting device; and
   a controller, coupled to the first and second switches, for individually controlling the first and second switches based on a control signal.

2. The double-sided display as claimed in claim 1, further comprising:
   an encapsulant filled between the first and second substrates and forming an isolated sealed space therebetween.

3. The double-sided display as claimed in claim 1, further comprising a software module for generating the control signal applied to the controller.

4. The double-sided display as claimed in claim 1, further comprising a hardware module for generating the control signal applied to the controller.

5. The double-sided display as claimed in claim 1, wherein at least one of the first and second organic light emitting devices comprises an active matrix organic light emitting diode or a passive matrix organic light emitting diode.

6. The double-sided display as claimed in claim 1, wherein at least one of the first and second organic light emitting devices comprises a side-by-side organic light emitting diode or a white organic light emitting diode.

* * * * *